US010203376B2

(12) United States Patent
Fukuhara

(10) Patent No.: US 10,203,376 B2
(45) Date of Patent: Feb. 12, 2019

(54) DEVICE, METHOD, AND NON-TRANSITORY RECORDING MEDIUM STORING PROGRAM FOR SPECIFYING ABNORMALITY-OCCURRENCE AREA OF SECONDARY BATTERY SYSTEM

(71) Applicant: NGK INSULATORS, LTD., Nagoya (JP)

(72) Inventor: Motohiro Fukuhara, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 399 days.

(21) Appl. No.: 15/053,226

(22) Filed: Feb. 25, 2016

(65) Prior Publication Data

US 2016/0169977 A1 Jun. 16, 2016

Related U.S. Application Data

(63) Continuation of application No. PCT/JP2014/071600, filed on Aug. 19, 2014.

(30) Foreign Application Priority Data

Aug. 30, 2013 (JP) .................................. 2013-180559

(51) Int. Cl.
*H02J 1/00* (2006.01)
*G01R 31/36* (2006.01)
(Continued)

(52) U.S. Cl.
CPC ..... *G01R 31/3658* (2013.01); *G01R 31/3648* (2013.01); *G01R 31/3679* (2013.01);
(Continued)

(58) Field of Classification Search
CPC ... H02J 1/00; G01R 1/00; H01M 2/00; H01M 2200/00; G05B 1/00; G05B 2219/00; H02H 1/00; H02M 1/00
See application file for complete search history.

(56) References Cited

U.S. PATENT DOCUMENTS

| 5,617,324 A | 4/1997 | Arai |
| 6,252,377 B1 * | 6/2001 | Shibutani ........... G01R 31/3624 |
| | | 320/132 |

(Continued)

FOREIGN PATENT DOCUMENTS

| EP | 2 110 679 A1 | 10/2009 |
| EP | 2 397 863 A1 | 12/2011 |

(Continued)

OTHER PUBLICATIONS

Extended European Search Report, European Application No. 14841083.0, dated May 26, 2017 (14 pages).

(Continued)

*Primary Examiner* — Jermele M Hollington
*Assistant Examiner* — Temilade Rhodes-Vivour
(74) *Attorney, Agent, or Firm* — Burr & Brown, PLLC

(57) ABSTRACT

An apparatus for identifying a position of an abnormality occurred in a secondary battery system includes an information acquisition unit for acquiring information about a module (module information) from among a plurality of modules included in a module series that accommodates a block for which the difference between a block voltage value and a block voltage value after a primary delay has changed so as to exceed a voltage threshold within a preset time before and after the point in time at which the block voltage value and series current value stopped being correlated, a notification reception unit for receiving a notification about the occurrence of an abnormality in a secondary battery, and a module specification unit for specifying at least the module corresponding to the latest module information as the module in which an abnormality occurred when the notification reception unit receives a notification.

6 Claims, 9 Drawing Sheets

(51) Int. Cl.
*G01R 1/00* (2006.01)
*H02M 1/00* (2006.01)
(52) U.S. Cl.
CPC ............... *G01R 1/00* (2013.01); *H02J 1/00* (2013.01); *H02M 1/00* (2013.01)

(56) References Cited

U.S. PATENT DOCUMENTS

| | | | |
|---|---|---|---|
| 6,453,249 B1 * | 9/2002 | Shibutani | G01R 31/3679 320/132 |
| 2003/0030442 A1 | 2/2003 | Sugimoto | |
| 2010/0004885 A1 * | 1/2010 | Nakanishi | B60L 3/0046 702/63 |
| 2012/0046893 A1 | 2/2012 | Kaneko et al. | |
| 2012/0242344 A1 * | 9/2012 | Ishishita | B60L 3/0046 324/430 |
| 2013/0113495 A1 * | 5/2013 | Kim | G01R 31/3606 324/434 |
| 2014/0021925 A1 * | 1/2014 | Asakura | B60L 3/0046 320/126 |
| 2014/0077596 A1 * | 3/2014 | Nishibayashi | H02J 1/00 307/29 |

FOREIGN PATENT DOCUMENTS

| | | |
|---|---|---|
| EP | 2 557 428 A1 | 2/2013 |
| JP | 03-158781 A1 | 7/1991 |

OTHER PUBLICATIONS

International Search Report and Written Opinion (Application No. PCT/JP2014/071600) dated Nov. 25, 2014.

* cited by examiner

| DATE (YEAR, MONTH, DAY) | TIME (HOUR, MINUTE) | MODULE STRING INFORMATION | MODULE INFORMATION | BLOCK INFORMATION | PRESENT BLOCK VOLTAGE VALUE |

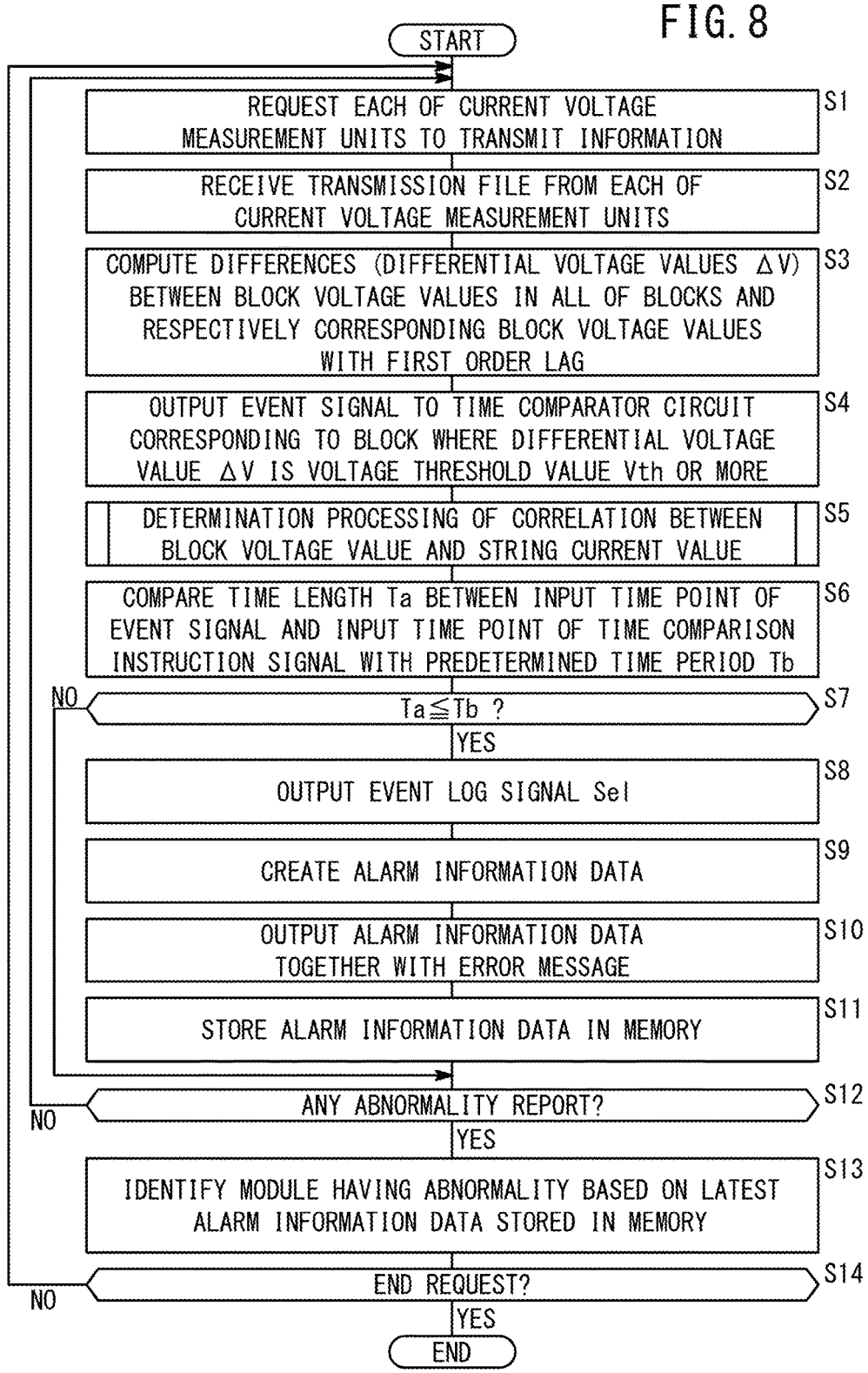

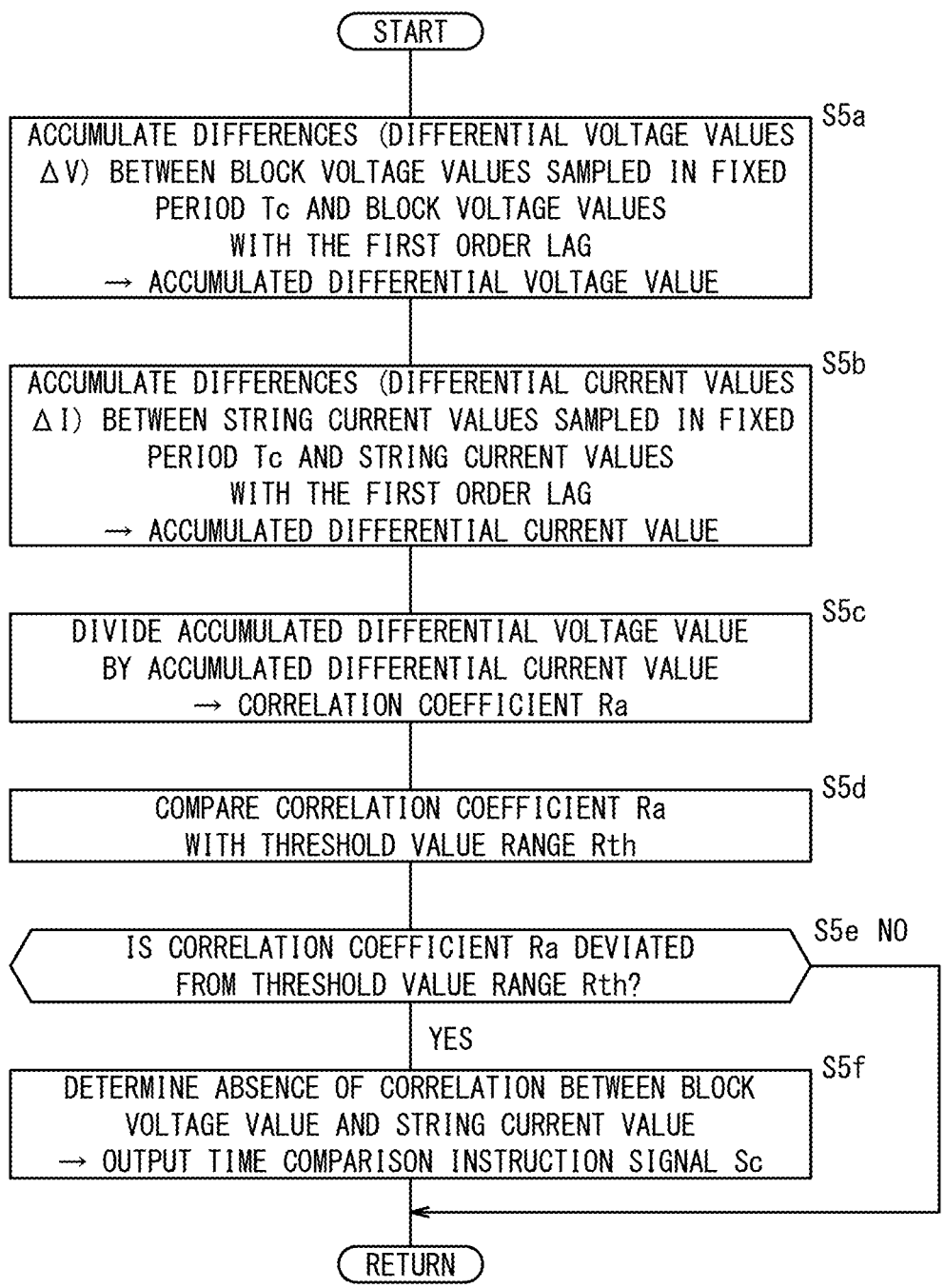

DEVICE, METHOD, AND NON-TRANSITORY RECORDING MEDIUM STORING PROGRAM FOR SPECIFYING ABNORMALITY-OCCURRENCE AREA OF SECONDARY BATTERY SYSTEM

CROSS-REFERENCE TO RELATED APPLICATIONS

This application is a Continuation of International Application No. PCT/JP2014/071600 filed on Aug. 19, 2014, which is based upon and claims the benefit of priority from Japanese Patent Application No. 2013-180559 filed on Aug. 30, 2013, the contents all of which are incorporated herein by reference.

TECHNICAL FIELD

The present invention relates to an apparatus (device), a method, and a non-transitory recording medium storing a program for identifying (specifying) a position of an abnormality (abnormality-occurrence area) occurred in a secondary battery system including two or more modules each accommodating one or more blocks. Each of the blocks is formed by connecting battery cells of two or more secondary batteries.

BACKGROUND ART

In general, frequency adjustment in an electric power system and adjustment of power demands and power supplies in the electric power system are carried out using a plurality of power generators, storage batteries, etc., equipped in the electric power system. Further, in most cases, adjustment in the difference between the generated electric power from natural energy based power generators and its planned output electric power, and reduction in the changes of electric power generated by the natural energy based power generators are also performed using the power generators, storage batteries, etc. In comparison with general electric power generators, the storage batteries can change the electric power output at high speed, and can be used effectively in frequency adjustment of the electric power system, adjustment of the difference between the generated electric power from natural energy based power generators and its planned output electric power, and adjustment of power demands and power supplies in the electric power system.

In this regard, as a storage battery operated at high temperature connected to the electric power system, a sodium-sulfur battery (hereinafter referred to as the NaS battery) is used, for example. This NaS battery is a high temperature secondary battery containing metal sodium and sulfur as active materials in an isolated manner using a solid electrolyte tube. When the NaS battery is heated at temperature of about 300° C., a certain amount of energy is produced by an electrochemical reaction of both of the melted active materials. Normally, the NaS battery is formed by assembling a plurality of battery cells, and used in a form of a module including a plurality of battery cells connected together. That is, the module has structure where circuits (strings) each formed by connecting a plurality of battery cells in series are connected in parallel to form a block, and at least two blocks are connected in series, and placed in a heat insulating container.

As a method of reporting occurrence of an abnormality of such a module, a method of detecting an abnormality of a battery by comparing electric discharge depth of each block, and notifying the abnormality is disclosed (e.g., see Japanese Laid-Open Patent Publication No. 03-158781). In this method, the presence of the abnormality is determined for each of the blocks of the module. Therefore, in comparison with the case of detecting the abnormality for each of the individual NaS battery cells of the block, the apparatus is not complicated, and the production cost can be reduced advantageously.

SUMMARY OF INVENTION

It is considered that failures in the battery cells, and consequently, failures in the modules are caused by internal short circuiting or external short circuiting in the battery cells.

For example, external short circuiting of the battery cells may be caused by formation of an external short circuiting loop due to leakage of active materials in the battery cells. For example, internal short circuiting of the battery cells may be caused by damages, etc. of a beta tube.

External short circuiting and internal short circuiting of these battery cells can be detected by checking the electric discharge depth in each block as can be seen from Japanese Laid-Open Patent Publication No 03-158781. However, the change in the electric discharge depth due to short circuiting does not occur rapidly, but occur gradually over a relatively long period of time Therefore, it is difficult to determine which module (or which block) has the abnormality, and initial response to the occurrence of the abnormality may be delayed undesirably.

The present invention has been made to take the problems of this type into account, and an object of the present invention is to provide an apparatus, a method, and a non-transitory recording medium storing a program for identifying a position of an abnormality occurred in a secondary battery system in which if an abnormality occurs, it is possible to identify a module (or a block) as the abnormality source at an early stage, and it is possible to implement an initial response to the occurrence of the abnormality at an early stage.

[1] An apparatus according to the first invention is an apparatus for identifying a position of an abnormality occurred in a secondary battery system. The secondary battery system includes a plurality of modules each accommodating one or more blocks. Each of the blocks is formed by connecting battery cells of two or more secondary batteries. The apparatus includes a voltage measurement unit configured to detect voltage of the secondary batteries on a block by block basis, and to output the detected voltage as a block voltage value, a string current measurement unit configured to measure electric current of a module string formed by connecting the plurality of modules in series to output the measured electric current as a string current value, an information acquisition unit configured to acquire module information of, among the plurality of modules included in the module string, a module accommodating a block where a difference between the block voltage value and the block voltage value with a first-order lag has been changed to exceed a voltage threshold value in a predetermined time period around a time point at which correlation between the block voltage value and the string current value is lost, a report reception unit configured to receive a report of an abnormality occurred in the secondary batteries, and a module identification unit configured to identify, as a module having the abnormality, the module corresponding to the module information at time of receiving the report by the report reception unit.

If external short circuiting or internal circuiting occurs in any one of the battery cells, the block voltage of the block including the battery cell having the short circuiting is decreased steeply. Thereafter, in some cases, after the elapse of a certain time period, the voltage returns to the original voltage level before short circuiting. Further, if the scale of the system becomes large, the number of blocks to be monitored is increased correspondingly. Therefore, it becomes further difficult to recognize the decrease in the voltage due to short circuiting from the changes of the block voltage of all of the blocks.

Further, even in the case where the block voltage value is decreased temporarily due to frequency adjustment in the power system, adjustment in the difference between the generated electric power from natural energy based power generators and its planned output electric power, adjustment of power demands and power supplies in the power system, etc., such a temporary decrease in the block voltage value may be detected erroneously as a temporary drop in the block voltage value due to short circuiting of at least one of the battery cells.

However, in the present invention, among a plurality of modules, information of a module (module information) accommodating a block where the difference between the block voltage and the block voltage with a first-order lag has been changed to exceed a predetermined voltage threshold value is acquired. Consequently, it is possible to accurately detect whether or not the block voltage has been decreased, and detect occurrence of an abnormality due to short circuiting.

Further, even in the case where the block voltage value is decreased temporarily due to frequency adjustment in the power system, adjustment in the difference between the generated electric power from natural energy based power generators and its planned output electric power, adjustment of power demands and power supplies in the power system, etc., such a temporary decrease in the block voltage value is not detected erroneously as a temporary drop in the block voltage value. It is because since correlation between the block voltage value and the string current value is maintained, such cases can be taken out of consideration at the time of detection.

Therefore, in the present invention, by identifying the module which is the source of the abnormality, it becomes possible to send a report to a local user, a local administrator, etc. Thus, countermeasures focused on the identified abnormality source can be taken at an early stage. It becomes possible to suppress expansion of damage.

[2] In the first invention, the apparatus may include a correlation determination unit configured to determine correlation between the block voltage value and the string current value. The correlation determination unit may include a differential voltage accumulation unit configured to accumulate differences between the block voltage values sampled in a predetermined fixed period and the block voltage values with the first-order lag, a differential current accumulation unit configured to accumulate differences between the string current values sampled in the fixed period and the string current values with the first-order lag, and a correlation coefficient computation unit configured to divide an accumulated differential voltage value obtained in the differential voltage accumulation unit by an accumulated differential current value obtained in the differential current accumulation unit to obtain a correlation coefficient in the fixed period. If the correlation coefficient obtained in the correlation coefficient computation unit is deviated from a predetermined range, correlation between the block voltage value and the string current value is determined as lost. In this manner, calculation becomes simple, and it is possible to confirm the presence or absence of correlation between the block voltage value and the string current value easily and promptly. It is also possible to achieve acceleration of computation.

[3] In this case, the predetermined range may be determined based on an I-V characteristic of the block. In this manner, it becomes easy to determine correlation between the block voltage value and the string current value.

[4] In the first invention, a time constant of the first-order lag may be selected in accordance with behavior where the block voltage drops temporarily due to short circuiting of at least one of the battery cells. In this manner, it is possible to improve the detection accuracy of the block having a temporary drop in the block voltage due to short circuiting of at least one of the battery cells.

[5] In the first invention, as the voltage threshold value, a voltage value of a temporary drop in the block voltage due to short circuiting of at least one of the battery cells may be selected. In this manner, it is possible to improve the detection accuracy of the block having a temporary drop in the block voltage due to short circuiting of at least one of the battery cells.

[6] In the first invention, the apparatus may further include an error output unit configured to receive the module information from the information acquisition unit, and to output the module information together with an error message. By outputting the module information together with the error message to a monitor or a printer, the position of the identified module can be recognized at a glance advantageously.

[7] A method according to the second invention is a method of identifying a position of an abnormality occurred in a secondary battery system. The secondary battery system includes a plurality of modules each accommodating one or more blocks. Each of the blocks is formed by connecting battery cells of two or more secondary batteries. The method includes the steps of performing voltage measurement by detecting voltage of the secondary batteries on a block by block basis, and outputting the detected voltage as a block voltage value, performing string current measurement by measuring electric current of a module string formed by connecting the plurality of modules in series to output the measured electric current as a string current value, performing information acquisition by acquiring module information of, among the plurality of modules included in the module string, a module accommodating a block where a difference between the block voltage value and the block voltage value with a first-order lag has been changed to exceed a voltage threshold value in a predetermined time period around a time point at which correlation between the block voltage value and the string current value is lost, performing report reception by receiving a report of an abnormality occurred in the secondary batteries, and performing module identification by identifying, as a module having the abnormality, the module corresponding to the module information at time of receiving the report in the report reception step.

[8] In the second invention, the method may include the step of performing correlation determination by determining correlation between the block voltage value and the string current value, the correlation determination step may comprise the steps of performing differential voltage accumulation by accumulating differences between the block voltage values sampled in a predetermined fixed period and the block voltage values with the first-order lag, performing differential current accumulation by accumulating differences between the string current values sampled in the fixed period and the string current values with the first-order lag, and performing correlation coefficient computation by dividing an accumulated differential voltage value obtained in the differential voltage accumulation step by an accumulated differential current value obtained in the differential current accumulation step to obtain a correlation coefficient in the fixed period. If the correlation coefficient obtained in the correlation coefficient computation step is deviated from a predetermined range, correlation between the block voltage and the string current value may be determined as lost.

[9] In this case, the predetermined range is determined based on an I-V characteristic of the block.

[10] In the second invention, a time constant of the first order lag may be selected in accordance with behavior where the block voltage drops temporarily due to short circuiting of at least one of the battery cells.

[11] In the second invention, as the voltage threshold value, a voltage value of a temporary drop in the block voltage due to short circuiting of at least one of the battery cells may be selected.

[12] In the second invention, the method may include the step of performing error output by receiving the module information from the information acquisition step, and outputting the module information together with an error message.

[13] A non-transitory recording medium according to the third invention stores a program for a secondary battery system including a plurality of modules each accommodating one or more blocks, the blocks each being formed by connecting battery cells of two or more secondary batteries, a voltage measurement unit configured to detect voltage of the secondary batteries on a block by block basis, and to output the detected voltage as a block voltage value, and a string current measurement unit configured to measure electric current of a module string formed by connecting the plurality of modules in series to output the measured electric current as a string current value. The program is configured to allow the secondary battery system to perform functions of acquiring information (module information) of, among the plurality of modules included in the module string, a module accommodating a block where a difference between the block voltage value and the block voltage value with a first-order lag has been changed to exceed a voltage threshold value in a predetermined time period around a time point at which correlation between the block voltage value and the string current value is lost, receiving a report of an abnormality occurred in the secondary batteries, and identifying, as a module having the abnormality, the module corresponding to the module information at time of receiving the report by the report reception function.

As described above, in the apparatus, the method, and the non-transitory recording medium storing the program for identifying a position where an abnormality occurs in a secondary battery system, it is possible to identify a module (or a block) as the abnormality source at an early stage, and it is possible to implement an initial response to the occurrence of the abnormality at an early stage.

BRIEF DESCRIPTION OF DRAWINGS

FIG. 7 is a diagram showing an example of a format of alarm information data;

FIG. 8 is a flow chart showing an example of processing operation in an information acquisition unit, a module identification unit, and a report reception unit; and FIG. 9 is a flow chart showing an example of processing operation in the correlation determination unit of the information acquisition unit.

DETAILED DESCRIPTION OF THE INVENTION

Hereinafter, an apparatus, a method, and a non-transitory recording medium storing a program for identifying a position of an abnormality occurred in a secondary battery system according to an embodiment of the present invention will be described with reference to FIGS. 1 to 9.

Figure 1:
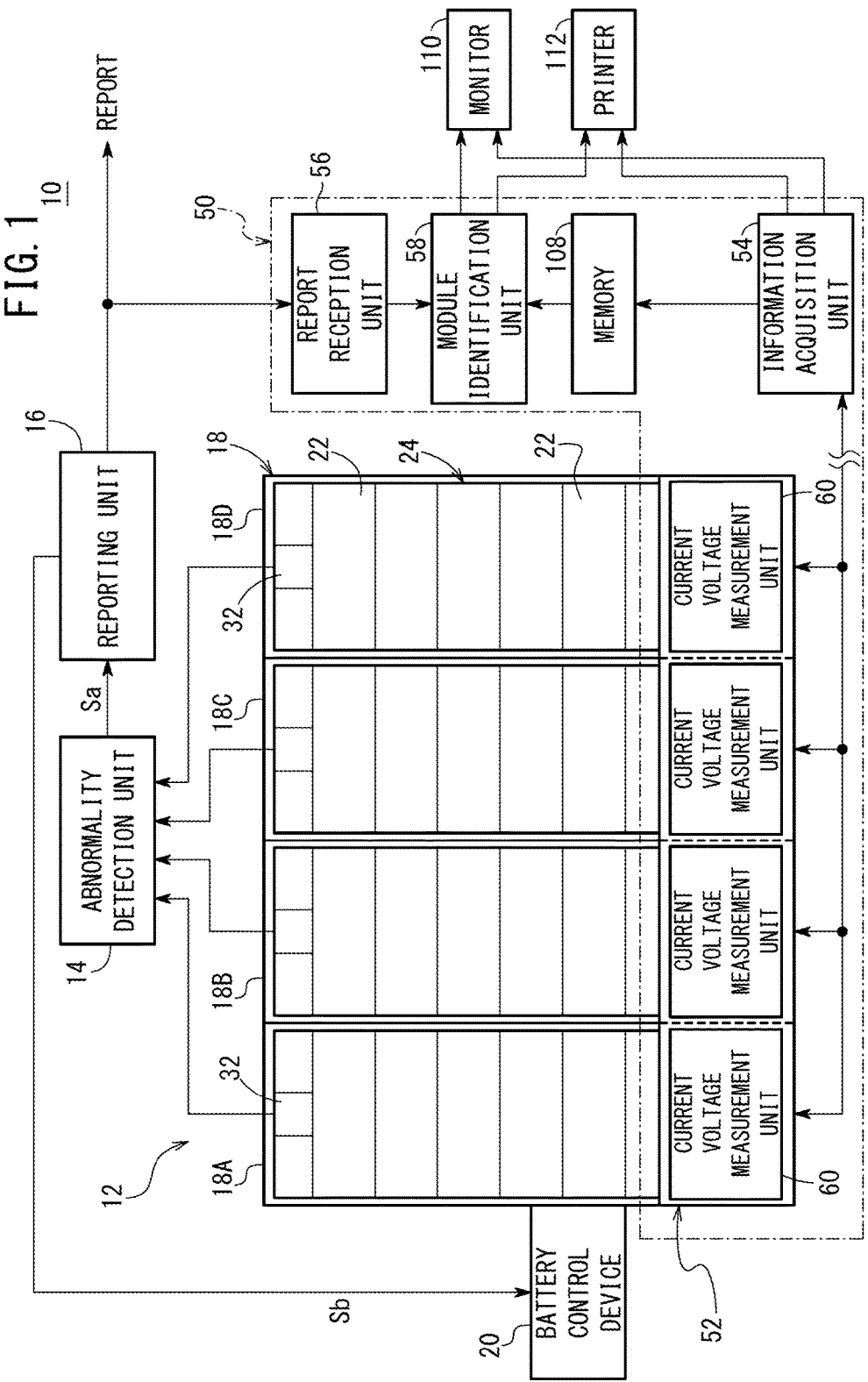
FIG. 1 is a diagram showing structure of a secondary battery system and an apparatus for identifying a position of an abnormality occurred in the secondary battery system according to an embodiment of the present invention.

Firstly, as shown in FIG. 1, a secondary battery system 10 to which the apparatus, the method, and the non-transitory recording medium storing the program according to the embodiment of the present invention is applied includes a secondary battery storage unit 12, an abnormality detection unit 14, and a reporting unit 16.

The secondary battery storage unit 12 has structure where a plurality of box shaped packages 18 are arranged in a lateral direction. In an example of FIG. 1, four packages 18 (first package 18A to fourth package 18D) are arranged in the lateral direction. Further, the secondary battery storage unit 12 has a battery control device 20 for controlling operation of the secondary batteries.

Two or more modules 22 are stacked in a vertical direction inside each of the packages 18. Further, each of the packages 18 accommodates a module string 24 formed by connecting these two or more modules 22 in series. In the structure of the example shown in FIG. 1, five modules 22 are stacked to form one module string 24.

Figure 2:
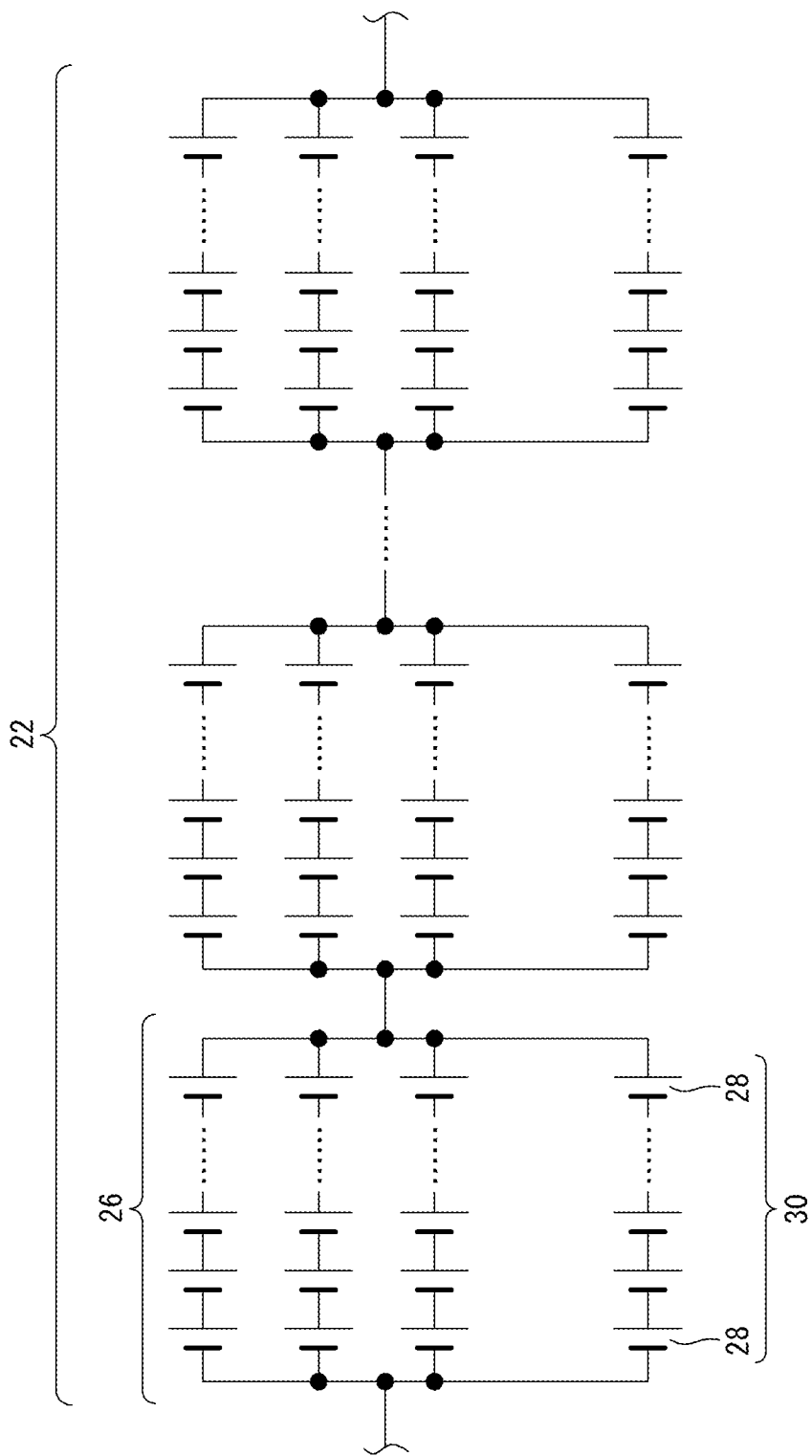
FIG. 2 is an equivalent circuit diagram showing a battery structural body included in a module.

As shown in FIG. 2, a battery structural body included in the module 22 is formed by connecting two or more blocks 26 in series. Each of the blocks 26 is formed by connecting two or more circuits (strings 30) in parallel, and each of the strings 30 is formed by connecting two or more battery cells 28 as the secondary batteries in series. For example, eight battery cells 28 are connected in series to form one string 30, 12 strings 30 are connected in parallel to form one block 26, and four blocks 26 are connected in series to form one module 22. As the secondary battery, a NaS battery, a lithium ion battery, a sodium ion battery, etc. may be used.

The abnormality detection unit 14 detects abnormal conditions such as a fire based on signals from sensors 32 (heat sensor, smoke sensor, etc.) provided in each of the packages 18.

The reporting unit 16 issues a report (abnormality report) indicating occurrence of an abnormality, and transmits the report to a monitoring center, etc., based on an input of an abnormality detection signal Sa (signal indicating occurrence of an abnormality) from the abnormality detection unit 14. In this case, the report may be transmitted through a public communications network such as the Internet or a mobile phone network. Further, the report may be transmitted to a local user, a local administrator, etc., instead of and/or in addition to the monitoring center.

Further, the reporting unit 16 outputs an operation stop signal Sb to the battery control device 20 in addition to the above report, based on the input of the abnormality detection signal Sa from the abnormality detection unit 14. The battery control device 20 stops operation of the secondary batteries in accordance with a predetermined sequence for stopping operation, based on the operation stop signal Sb.

Further, as shown in FIG. 1, an apparatus for identifying a position of an abnormality according to an embodiment of the present invention (hereinafter referred to as an abnormality identification apparatus 50) includes an information transmission unit 52, an information acquisition unit 54, a report reception unit 56, and a module identification unit 58.

Figure 3:
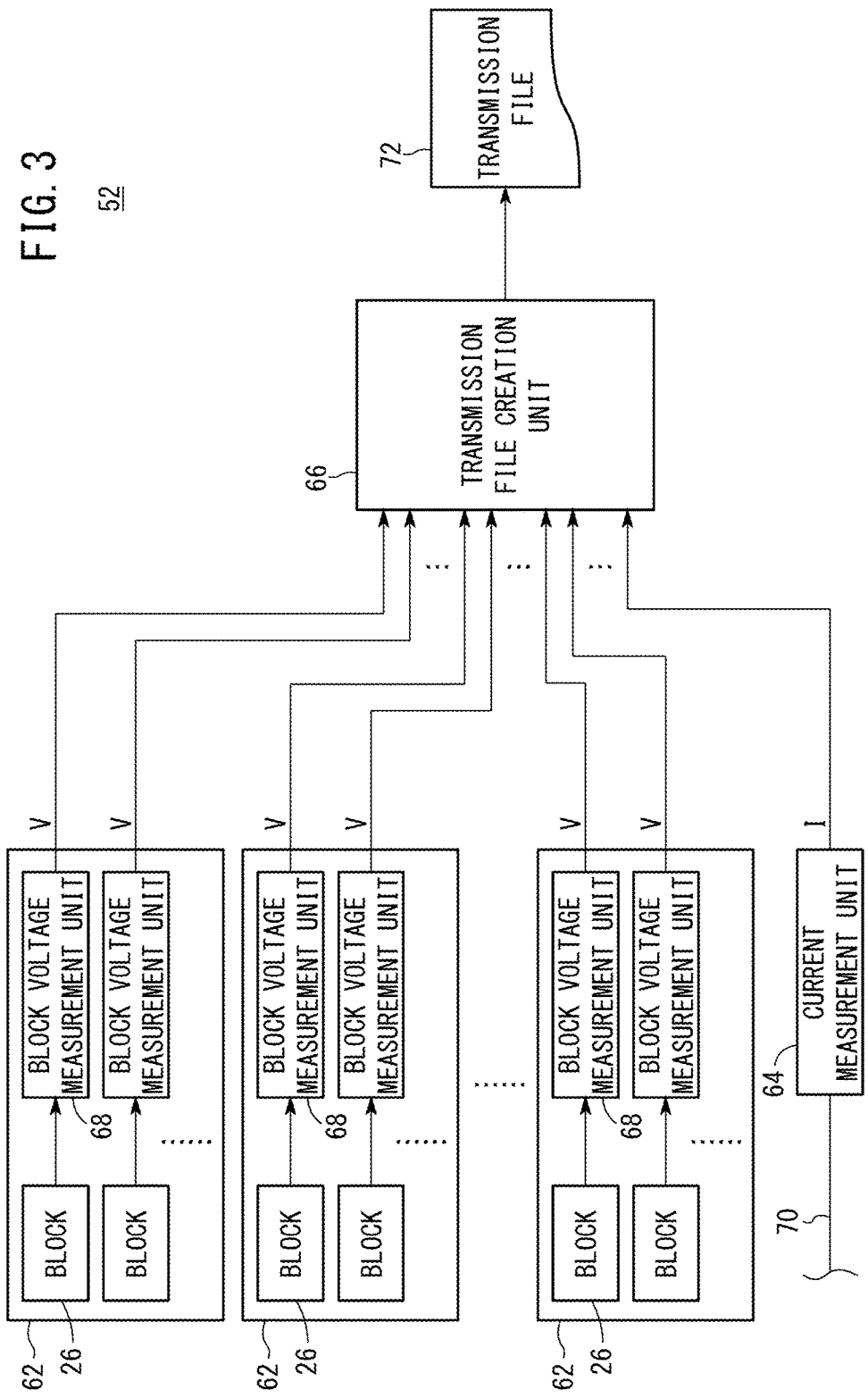
FIG. 3 is a block diagram showing structure of an information transmission unit.

The information transmission unit 52 has a plurality of current voltage measurement units 60 provided for the respective module strings 24. As shown in FIG. 3, each of the current voltage measurement units 60 includes a plurality of voltage measurement units 62 provided for the respective modules 22, one current measurement unit 64, and one transmission file creation unit 66.

The voltage measurement unit 62 has block voltage measurement units 68 provided for the respective blocks 26. Each of the block voltage measurement units 68 measures the voltage across both ends of the corresponding block 26 in accordance with a predetermining monitoring cycle. For example, the block voltage measurement unit 62 measures the voltage across both ends of the corresponding block 26 at a time interval arbitrarily selected in a range from 0.2 to 2 seconds (e.g., 200 msec interval: monitoring cycle).

The current measurement unit 64 measures the electric current of the corresponding module string 24 (string current value I) through a current measurement line 70 in accordance with the above described monitoring cycle.

Each of the transmission file creation units 66 creates a transmission file 72 including information of the corresponding module string 24 at each monitoring cycle. For example, the information of the module string 24 includes an identification number of the module string 24 (module string information), present string current value I, information of a plurality of modules 22 included in the module string 24, etc. For example, the information of the module 22 includes an identification number of the module 22 (module information), identification numbers of a plurality of blocks 26 included in the module 22 (block information), and the present block voltage value V corresponding to the plurality of blocks 26, respectively.

Figure 4:
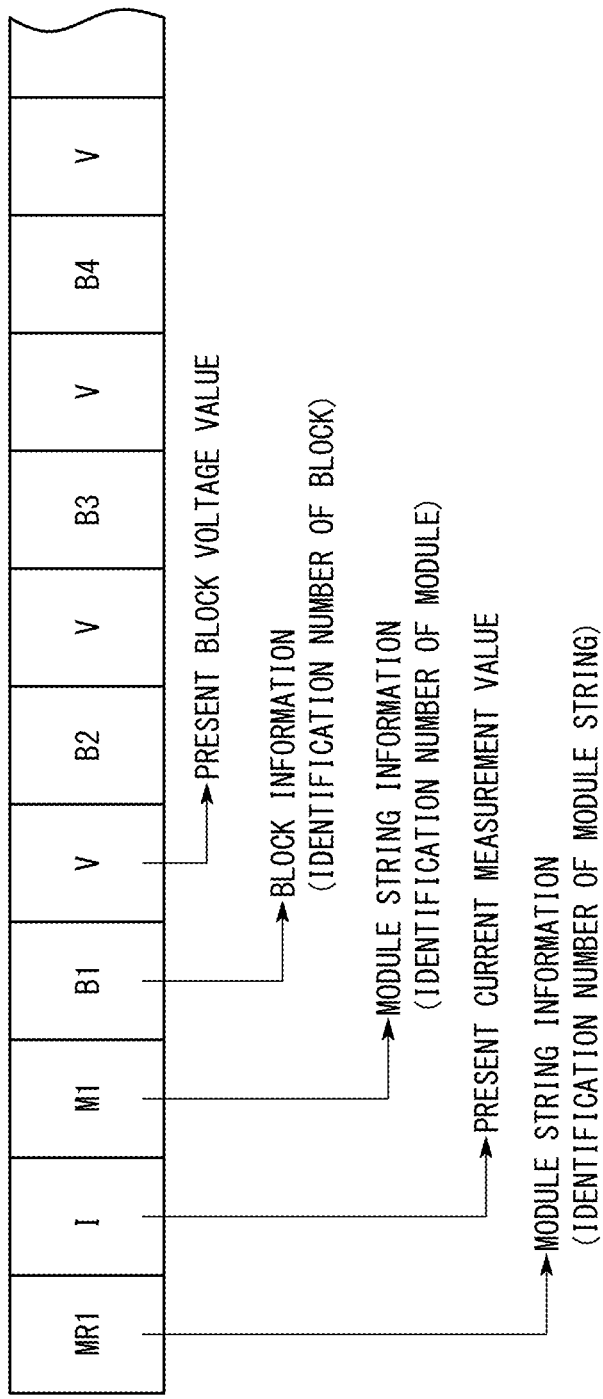
FIG. 4 is a diagram showing an example of a format of a transmission file.

As an example of a format of a transmission file 72, a format of the transmission file 72 associated with the first module string 24 is shown in FIG. 4. Specifically, in the order from the beginning, the format of the transmission file 72 includes an identification number (MR1) of the first module string 24, a present string current value I in the first module string 24, and information of a plurality of modules 22 included in the first module string 24.

As an example of the information of the module 22, the format of information of the first module 22 includes an identification number (M1) of the first module 22, and information of a plurality of blocks 26 included in this module 22.

For example, the information of the plurality of blocks 26 includes the following items of information:
(a1) Identification number (B1) of the first block 26
(a2) Present block voltage value V of the first block 26
(a3) Identification number (B2) of the second block 26
(a4) Present block voltage value V of the second block 26
(a5) Identification number (B3) of the third block 26
(a6) Present block voltage value V of the third block 26
(a7) Identification number (B4) of the fourth block 26
(a8) Present block voltage value V of the fourth block 26

In the meanwhile, with regard to the module string 24 which lost correlation between the block voltage value and the string current value, among the plurality of module strings 24, the information acquisition unit 54 acquires information of the module 22 accommodating the block 26 which satisfies the following conditions.

(b1) The present time is within a predetermined period around a time point at which the above described correlation is lost.

Figure 5:
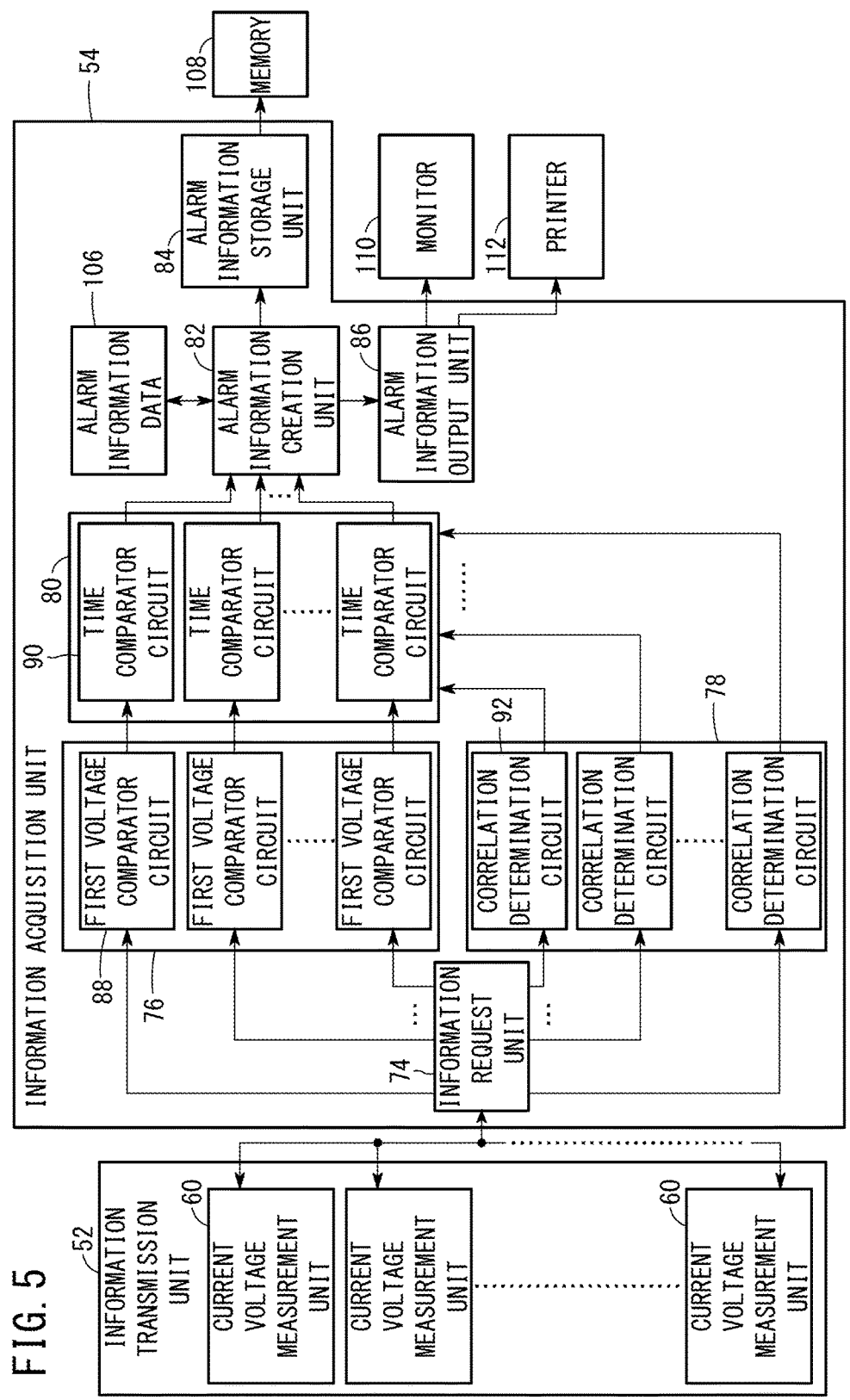
FIG. 5 is a block diagram showing structure of an information acquisition unit and an information transmission unit.

(b2) Among the plurality of modules 22 included in this module string 24, a module 22 accommodating a block 26 where the difference (differential voltage value $\Delta V$) between the present block voltage value V and the block voltage value Vr with a first-order lag has been changed to exceed a predetermined voltage threshold value Vth Specifically, as shown in FIG. 5, the information acquisition unit 54 includes an information request unit 74, a voltage comparator unit 76, correlation determination unit 78, a time comparator unit 80, an alarm information creation unit 82, an alarm information storage unit 84, and an alarm information output unit 86.

The information request unit 74 requests each of the current voltage measurement units 60 of the information transmission unit 52 to transmit information at each monitoring cycle. Upon the transmission request of information from the information request unit 74, each of the current voltage measurement units 60 transmits the transmission file 72 including information of the corresponding module string 24, to the information acquisition unit 54.

The voltage comparator unit 76 includes a plurality of first voltage comparator circuits 88 provided in correspondence with the plurality of blocks 26. Likewise, the time comparator unit 80 includes a plurality of time comparator circuits 90 provided in correspondence with the plurality of blocks 26.

Figure 6:
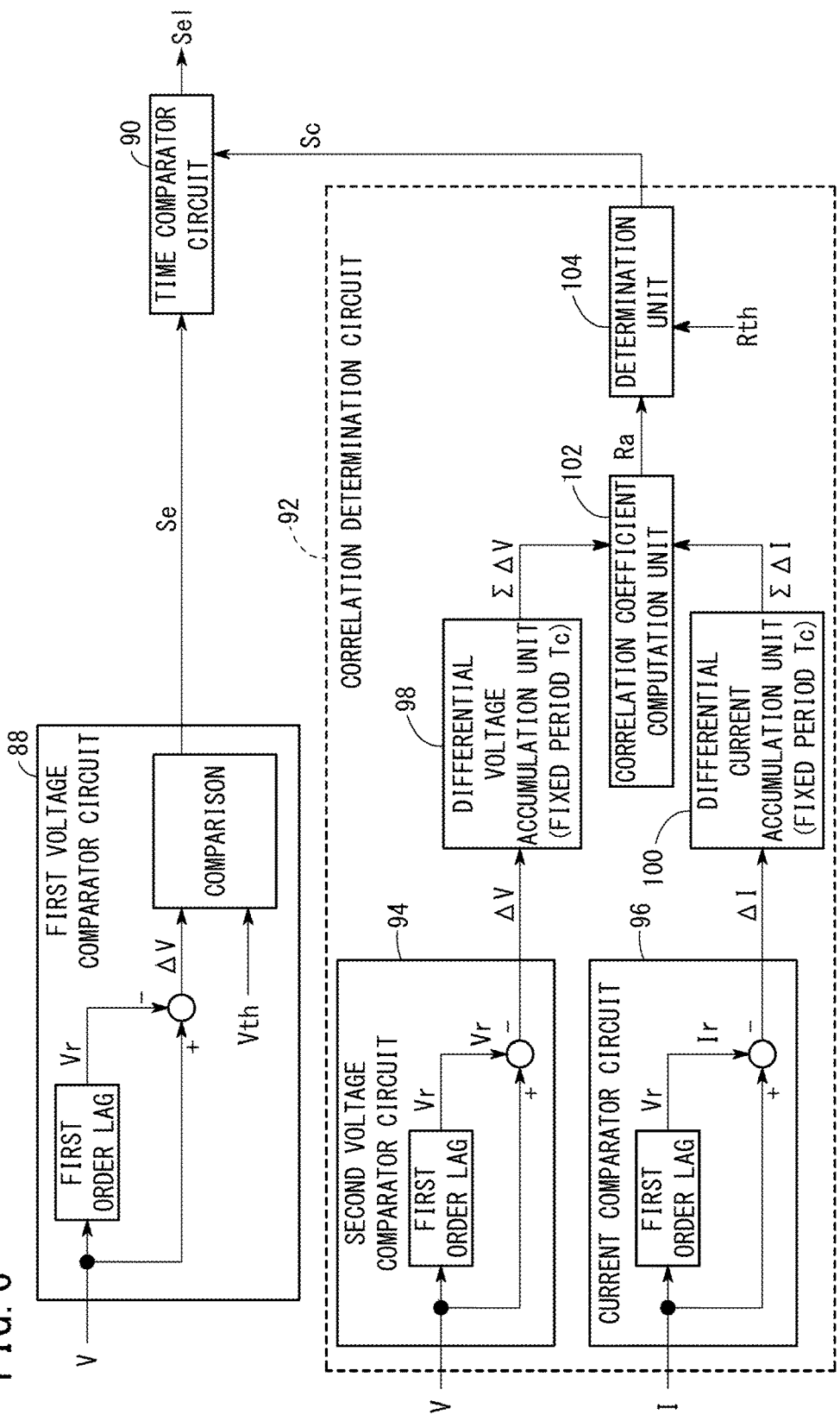
FIG. 6 is a block diagram showing structure of a first voltage comparator circuit, a correlation determination circuit (second voltage comparator circuit, current comparator circuit, etc.), and a time comparator circuit.

The first voltage comparator circuit 88 will be described taking one block 26 as an example. As shown in FIG. 6, the difference (differential voltage value $\Delta V$) between the block voltage V of the block 26 included in the acquired transmission file 72 and the block voltage Vr with the first-order lag is calculated. If the differential voltage value $\Delta V$ is equal to or greater than the predetermined voltage threshold value Vth, the first voltage comparator circuit 88 outputs an event signal Se to the corresponding time comparator circuit 90. In the first-order lag function $1-e^{-(t/TL)}$, one monitoring cycle (e.g., 200 msec) may be selected as "t". For example, the time constant TL may be selected in accordance with the behavior where the corresponding string 30 is insulated, and the block voltage V drops temporarily due to short circuiting of one battery cell 28. For example, a time period selected from, e.g., from 20 to 60 seconds (e.g., 40 seconds) may be adopted arbitrarily. Further, as the voltage threshold value Vth, for example, a voltage value of a temporary drop due to short circuiting of one battery cell 28, e.g., 200 mV may be selected.

As shown in FIG. 5, the correlation determination unit 78 includes a plurality of correlation determination circuits 92 provided in correspondence with the plurality of blocks 26 (see FIG. 2).

The correlation determination circuit 92 will be described taking one block 26 as an example. As shown in FIG. 6, the correlation determination circuit 92 includes a second voltage comparator circuit 94, a current comparator circuit 96, a differential voltage accumulation unit 98, a differential current accumulation unit 100, a correlation coefficient computation unit 102, and a determination unit 104.

As in the case of the above described first voltage comparator circuit 88, the second voltage comparator circuit 94 calculates the difference (differential voltage value $\Delta V$) between the block voltage V of the block 26 included in the acquired transmission file 72 and the block voltage Vr with the first-order lag.

The current comparator circuit 96 calculates the difference (differential current value $\Delta I$) between the string current value I of the module string 24 included in the acquired transmission file 72 and the string current value Ir with the first-order lag.

In each of the first-order lag functions $1-e^{-(t/TL)}$, t and TL in the above described second voltage comparator circuit 94 and the current comparator circuit 96 have the same values as those of the first voltage comparator circuit 88. Specifically, one monitoring cycle (e.g., 200 msec) may be selected as "t". For example, 40 seconds may be selected as the time constant TL. It is a matter of course that values which are different from those of the first voltage comparator circuit 88 may be selected. For example, the first voltage comparator circuit 88 may adopt, e.g., one second as "t" of the first-order lag function, and the second voltage comparator circuit 94 and the current comparator circuit 96 may adopt, e.g., 200 msec as "t" of the first-order lag function. The first voltage comparator circuit 88 may be used as the above second voltage comparator circuit 94, as long as the first-order lag function is the same.

The differential voltage accumulation unit 98 computes the sum of the differences (differential voltage values $\Delta V$) between the block voltage values V sampled in a predetermined fixed period Tc and the block voltage values Vr with the first-order lag. That is, the differential voltage values $\Delta V$ successively outputted from the second voltage comparator circuit 94 are accumulated over the fixed period Tc to obtain the accumulated differential voltage value $\Sigma \Delta V$. For example, a value in a range from 3 to 5 seconds where the number of sampling times is in a range from 10 to 30 inclusive may be selected for the fixed period Tc.

The differential current accumulation unit 100 computes the sum of differences (differential current values $\Delta I$) between the string current values I sampled in the fixed period Tc and the string current values Ir with the first-order lag. That is, the differential current values $\Delta I$ successively outputted from the current comparator circuit 96 are accumulated over the fixed period Tc to obtain the accumulated differential current value $\Sigma \Delta I$.

The correlation coefficient computation unit 102 divides the accumulated differential voltage value $\Sigma \Delta V$ obtained in the differential voltage accumulation unit 98 by the accumulated differential current value $\Sigma \Delta I$ obtained in the differential current accumulation unit 100 ($\Sigma \Delta V/\Sigma \Delta I$)) to obtain a correlation coefficient Ra in the fixed period Tc.

In the case where the correlation coefficient Ra obtained in the correlation coefficient computation unit 102 is deviated from a predetermined threshold range Rth, correlation between the block voltage value V and the string current value I is determined as lost, and the determination unit 104 outputs a time comparison instruction signal Sc to a time comparator circuit 90 corresponding to the block 26. Preferably, the threshold value range Rth is determined based on the I-V (Current-Voltage) characteristics of the block 26.

As described above, the time comparator unit 80 (see FIG. 5) includes the plurality of time comparator circuits 90 provided in correspondence with the plurality of blocks 26. The time comparator circuit 90 will be described taking one block 26 as an example. Specifically, as shown in FIG. 6, a time length Ta between the time point at which the event signal Se from the corresponding first voltage comparator circuit 88 is inputted and the time point at which the time comparison instruction signal Sc from the corresponding correlation determination circuit 92 is inputted, is compared with a predetermined time length (predetermined time period Tb). If the time length Ta between these input time points is within the predetermined time period Tb, an event log signal Sel is outputted from the time comparator circuit 90 to the alarm information creation unit 82.

No event log signal Sel is outputted in the following cases (c1) to (c3). As the predetermined time period Tb, for example, a time period selected from 3 to 60 seconds (e.g., 10 seconds) may be adopted arbitrarily.

(c1) Case where the time length Ta between the input time points exceeds the predetermined time period Tb (c2) Case where no time comparison signal Sc is inputted even after elapse of the predetermined time period Tb from the input time point of the event signal Se from the corresponding first voltage comparator circuit 88.

(c3) Case where no event signal Se is inputted even after elapse of the predetermined time period Tb from the input time point of the time comparison instruction signal Sc from the corresponding correlation determination circuit 92.

The alarm information creation unit 82 creates alarm information data 106 based on the input of the event log signal Sel outputted from the time comparator unit 80, and transmits the alarm information data 106 to the alarm information storage unit 84 and the alarm information output unit 86. For example, the following items of information are registered as the alarm information data 106.

(d1) Identification number of the module string 24 accommodating the block 26 corresponding to the time comparator circuit 90 as an output source of the event log signal Sel (module string information)

(d2) Identification number of the module 22 (module information)

(d3) Identification number of the block 26 (block information)

For example, as shown in FIG. 7, as one piece of alarm information data 106, from the beginning part, the present date (year, month, day), the present time (hour, minute), the module string information, the module information, the block information, and the present block voltage value V are stored.

The alarm information storage unit 84 stores the alarm information data 106 created by the alarm information creation unit 82 in a memory 108 which adopts a stack method (last-in first-out method). Therefore, the alarm information data 106 retrieved from the memory 108 is the latest alarm information data 106.

The alarm information output unit 86 converts the alarm information data 106 transmitted successively from the alarm information creation unit 82 into display data and printing data, and outputs these items of data to a monitor 110 and a printer 112, respectively, together with an error message (such as a message "SHORT-CIRCUITING ABNORMALITY"). Consequently, the alarm information (year, month, day, time, module string information, module information, block information, present block voltage value V) is displayed together with the error message on the monitor 110, and printed by the printer 112 together with the error message.

In the meanwhile, as shown in FIG. 1, the report reception unit 56 receives the report (abnormality report) indicating occurrence of an abnormality from the reporting unit 16. Specifically, when the report reception unit 56 receives the abnormality report, the report reception unit 56 starts operation of the module identification unit 58.

The module identification unit 58 identifies, among the plurality of modules 22, a module 22 corresponding to the module string information and the module information registered in the latest alarm information data 106 as a module 22 having the abnormality.

Specifically, operation of the module identification unit 58 is started by the report reception unit 56, and the module identification unit 58 identifies, as a module 22 having the abnormality, the module 22 corresponding to the module string information and the module information registered in the latest alarm information data 106 stored in the memory 108. The identified module 22 is notified to, e.g., an operator by outputting the module information and the error message (for example, "ACCIDENT IN THE FIRST MODULE") to the monitor 110 and/or the printer 112. Further, preferably, an image with a symbol indicating occurrence of the accident may be displayed on the monitor 110, or printed on a printing paper, together with a schematic image of the secondary battery storage unit 12, at the position of the identified module 22. In this manner, the position of the identified module 22 can be recognized at a glance.

Next, processing operation of the abnormality identification apparatus 50 according to the embodiment of the present invention will be described with reference to flow charts in FIGS. 8 and 9.

Firstly, in step S1 of FIG. 8, the information request unit 74 requests each of the current voltage measurement units 60 of the information transmission unit 52 to transmit information. Upon the transmission request of information from the information request unit 74, each of the current voltage measurement units 60 transmits a transmission file 72 including information of the corresponding module string 24 to the information acquisition unit 54.

In step S2, the information acquisition unit 54 receives the transmission file 72 from each of the current voltage measurement units 60.

In step S3, the voltage comparator unit 76 of the information acquisition unit 54 calculates the difference (differential voltage value $\Delta V$) between the block voltage V and the corresponding block voltage Vr with a first-order lag for each and all of the blocks 26 in the acquired transmission file 72.

In step S4, the voltage comparator unit 76 outputs an event signal Se to the time comparator circuit 90 corresponding to the block 26 having the differential voltage value $\Delta V$ equal to or greater than the voltage threshold value Vth, among all of the blocks 26.

In the meanwhile, in step S5, the correlation determination unit 78 of the information acquisition unit 54 determines correlation between the block voltage value V and the string current value I. The correlation determination unit 78 determines the correlation between the block voltage value V and the string current value I based on the difference (differential voltage value $\Delta V$) between the block voltage V and the corresponding block voltage Vr with the first-order lag, and the difference (differential current value $\Delta I$) between the string current value I and the corresponding string current value Ir with the first-order lag, for each and all of the blocks 26 in the acquired transmission file 72.

Specifically, for all of the blocks 26, processing in steps S5a to S5f as shown in FIG. 9 is performed. That in step S5a of FIG. 9, the differential voltage accumulation unit 98 accumulates differences (differential voltage values $\Delta V$) between block voltage values V sampled in a predetermined fixed period Tc and block voltage values Vr with the first-order lag to obtain an accumulated differential voltage value $\Sigma \Delta V$. In step S5b, the differential current accumulation unit 100 accumulates the differences (differential current values $\Delta I$) between string current values I sampled in the fixed period To and string current value Ir with the first-order lag to obtain an accumulated differential current value $\Sigma \Delta I$. In step S5c, the correlation coefficient computation unit 102 divides the accumulated differential voltage value $\Sigma \Delta V$ by the accumulated differential current value $\Sigma \Delta I$ to obtain the correlation coefficient Ra in the fixed period Tc. In step S5d, the determination unit 104 compares the correlation coefficient Ra obtained in the correlation coefficient computation unit 102 with the predetermined threshold value range Rth. In step S5e, if it is determined that the correlation coefficient Ra is deviated from the threshold value range Rth, the control proceeds to step S5f to determine that correlation between the block voltage value V and the string current value I has been lost, and outputs a time comparison instruction signal Sc to the time comparator circuit 90 corresponding to the block.

Referring back to the main routine in FIG. 8, in the next step S6, among the time comparator circuits 90 included in the time comparator unit 80, a time comparator circuit 90 which received the inputs of the event signal Se and the time comparison instruction signal Sc compares the time length Ta between the input time point of the event signal Se and the input time point of the time comparison instruction signal Sc with the predetermined time length (predetermined time period Tb).

In step S7, if it is determined that the time length Ta between the input time points is within the predetermined time period Tb, the control proceeds to step S8 to output an event log signal Sel from the time comparator circuit 90 to the alarm information creation unit 82.

In step S9, the alarm information creation unit 82 creates the alarm information data 106. Specifically, the alarm information creation unit 82 creates the alarm information data 106 having registrations of the following items of information or the like.

(e1) Present date and time (e2) Identification number of the module string 24 accommodating the block 26 corresponding to the time comparator circuit 90 as an output source of the event log signal Sel (module string information)

(e3) Identification number of the module 22 (module information)

(e4) Identification number of the block 26 (block information)

In step S10, the alarm information output unit 86 converts the created alarm information data 106 into display data and printing data, and outputs these items of data to the monitor 110 and the printer 112, respectively, together with an error message (such as a message "SHORT-CIRCUITING ABNORMALITY").

In step S11, the alarm information storage unit 84 stores the alarm information data 106 created by the alarm information creation unit 82 in the memory 108 which adopts a stack method (last-in first-out method).

When the process in step S11 is finished, or in step S7, if it is determined that the time length Ta between the input time points exceeds the predetermined time period Tb, in step S12, the report reception unit 56 determines whether there is any report (abnormality report) indicating occurrence of an abnormality from the reporting unit 16. If no abnormality report has been received, the routine returns to step S1 to repeat the processes of step S1 and the subsequent steps.

If any abnormality report has been received, the routine proceeds to the next step S13 to perform operation in the module identification unit 58. Specifically, the module identification unit 58 identifies, as a module 22 having the abnormality, a module 22 corresponding to the module string information and the module information registered in the latest alarm information data 106 stored in the memory 108. Then, the module identification unit 58 outputs the module information and the error message regarding the identified module 22 to the monitor 110 and/or the printer 112.

In step S14, it is determined whether or not there is a request for stopping operation of the information acquisition unit 54 (e.g., end request due to interruption of the power supply, maintenance operation, etc.). If there is no request for stopping operation, the routine returns to step S1 to repeat the processes of step S1 and the subsequent steps. When a request for stopping operation is made, operations of the information acquisition unit 54 are stopped.

As described above, in the abnormality identification apparatus 50 and the abnormality identification method according to the embodiment of the present invention, the following advantages are obtained.

Specifically, normally, if external short circuiting or internal short circuiting occurs in any one of the battery cells 28, the block voltage value V of the block 26 including the battery cell 28 having the short circuiting decreased steeply. Thereafter, in some cases, after the elapse of a few minutes, the voltage returns to the original voltage level before short circuiting. Further, if the scale of the system becomes large, the number of blocks to be monitored is increased correspondingly. Therefore, it becomes more difficult to recognize the decrease in the voltage due to short circuiting from the changes of the block voltage values V of all of the blocks 26.

Further, when the block voltage value V is decreased temporarily, e.g., by adjustment in the frequency of the electric power system, adjustment in the difference between the generated electric power from natural energy based power generators and its planned output electric power, and adjustment of power demands and power supplies in the electric power system, in some cases, this decrease in the block voltage value V may be detected erroneously as the temporary drop of the block voltage value V due to short circuiting of at least one of the battery cells 28.

However, in the embodiment of the present invention, among the plurality of modules 22 included in the module string 24, information of a module 22 accommodating a block 26 is acquired where the difference (differential voltage value $\Delta V$) between the block voltage value V and the block voltage value Vr with a first-order lag has been changed to exceed a predetermined voltage threshold value Vth in a predetermined time period around a time point at which correlation between the block voltage value V and the string current value I is lost. Consequently, it is possible to accurately detect whether there is a decrease in the block voltage value V, and detect occurrence of an abnormality due to short circuiting.

In particular, the differences (differential voltage values $\Delta V$) between block voltage values V sampled in a predetermined fixed period Tc and the block voltage values Vr with the first-order lag are accumulated, and the differences (differential current values $\Delta I$) between string current values I sampled in the fixed period Tc and string current values Ir with the first-order lag are accumulated. The obtained accumulated differential voltage value $\Sigma \Delta V$ is divided by the obtained accumulated differential current value $\Sigma \Delta I$ to obtain the correlation coefficient Ra in the fixed period Tc. In the case where the obtained correlation coefficient Ra is deviated from the predetermined threshold range Rth, correlation between the block voltage value V and the string current value I is determined as lost. In this manner, calculation becomes simple, and it is possible to confirm the presence or absence of correlation between the block voltage value V and the string current value I easily and promptly. It is also possible to achieve acceleration of computation.

Further, even in the case where the block voltage value V is decreased temporarily due to various adjustment, e.g., listed below, since correlation between the block voltage value V and the string current value I is maintained, such cases can be taken out of consideration at the time of detection, and such a detection is not recognized as the temporal drop in the block voltage value V due to short circuiting of at least one of the battery cells 28.

(f1) Frequency adjustment in the power system (f2) Adjustment in the difference between the generated electric power from natural energy based power generators and its planned output electric power (f3) adjustment of power demands and power supplies in the power system Further, the alarm information data 106 is created based on information of the acquired module 22, and at the time of receiving the abnormality report in the report reception unit 56, a module 22 corresponding to at least the latest alarm information data 106 is identified as a module 22 having the abnormality. In this manner, by identifying the module 22 which is the source of the abnormality, it becomes possible to transmit a report to a local user, a local administrator, etc. Therefore, countermeasures focused on the identified abnormality source can be taken at an early stage. It becomes possible to suppress expansion of the damage.

Further, the time constant of the first-order lag is selected according to the behavior of the temporary drop in the block voltage V due to short circuiting of at least one of the battery cells 28. Further, as the voltage threshold value Vth, for example, a voltage value for the temporary voltage drop in the block voltage V due to short circuiting of at least one of the battery cells 28 is selected. In this manner, it is possible to improve the detection accuracy of the block 26 having a temporary drop in the block voltage V due to short circuiting of at least one the battery cells 28.

It is a matter of course that the apparatus, the method, and the non-transitory recording medium storing the program for identifying a position of an abnormality occurred in a secondary battery system according to the present invention is not limited to the embodiments described above, and various structures can be adopted without deviating from the gist of the present invention.

What is claimed is:

1. A method of identifying a position of an abnormality occurred in a secondary battery system, the secondary battery system comprising a plurality of modules each accommodating one or more blocks, the blocks each being formed by connecting battery cells of two or more secondary batteries, the method comprising the steps of:

performing voltage measurement by detecting voltage of the secondary batteries on a block by block basis, and outputting the detected voltage as a block voltage value;

performing string current measurement by measuring electric current of a module string formed by connecting the plurality of modules in series to output the measured electric current as a string current value;

performing information acquisition by acquiring module information of, among the plurality of modules included in the module string, a module accommodating a block where a difference between the block voltage value and the block voltage value with a first-order lag has been changed to exceed a voltage threshold value in a predetermined time period around a time point at which correlation between the block voltage value and the string current value is lost;

performing report reception by receiving a report of an abnormality occurred in the secondary batteries; and performing module identification by identifying, as a module having the abnormality, the module corresponding to the module information at time of receiving the report in the report reception step.

2. The method according to claim 1, further comprising the step of performing correlation determination by determining correlation between the block voltage value and the string current value, wherein the correlation determination step comprises the steps of:

performing differential voltage accumulation by accumulating differences between the block voltage values sampled in a predetermined fixed period and the block voltage values with the first-order lag;

performing differential current accumulation by accumulating differences between the string current values sampled in the fixed period and the string current values with the first-order lag; and performing correlation coefficient computation by dividing an accumulated differential voltage value obtained in the differential voltage accumulation step by an accumulated differential current value obtained in the differential current accumulation step to obtain a correlation coefficient in the fixed period;

wherein in a case that the correlation coefficient obtained in the correlation coefficient computation step is deviated from a predetermined range, correlation between the block voltage and the string current value is determined as lost.

3. The method according to claim 2, wherein the predetermined range is determined based on an I-V characteristic of the block.

4. The method according to claim 1, wherein a time constant of the first-order lag is selected in accordance with behavior where the block voltage drops temporarily due to short circuiting of at least one of the battery cells.

5. The method according to claim 1, wherein, as the voltage threshold value, a voltage value of a temporary drop in the block voltage due to short circuiting of at least one of the battery cells is selected.

6. The method according to claim 1, further comprising the step of performing error output by receiving the module information from the information acquisition step, and outputting the module information together with an error message.

* * * * *